(12) United States Patent
Kim

(10) Patent No.: US 9,024,414 B2
(45) Date of Patent: May 5, 2015

(54) SEMICONDUCTOR DEVICE AND METHOD FOR FORMING THE SAME

(71) Applicant: SK Hynix Inc., Icheon (KR)

(72) Inventor: Jae Bum Kim, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/218,751

(22) Filed: Mar. 18, 2014

(65) Prior Publication Data

US 2015/0028453 A1   Jan. 29, 2015

(30) Foreign Application Priority Data

Jul. 29, 2013 (KR) .......................... 10-2013-0089666

(51) Int. Cl.
  *H01L 29/167* (2006.01)
  *H01L 21/332* (2006.01)
  *H01L 29/06* (2006.01)
  *H01L 29/36* (2006.01)

(52) U.S. Cl.
  CPC ................ *H01L 29/06* (2013.01); *H01L 29/36* (2013.01)

(58) Field of Classification Search
  CPC ............ H01L 21/3225; H01L 21/3221; H01L 21/26506; H01L 21/3105; H01L 29/00; H01L 29/06; H01L 29/36; H01L 21/3003; H01L 21/76254
  USPC ........... 438/471, 473–475; 257/607, 610–612
  See application file for complete search history.

(56) References Cited

U.S. PATENT DOCUMENTS 6,391,746 B1   5/2002   Gonzalez et al.

FOREIGN PATENT DOCUMENTS

KR   10-2011-0003049 A   1/2011

*Primary Examiner* — Hsien Ming Lee

(57) ABSTRACT

A semiconductor device in which a gettering layer is formed in a semiconductor substrate, and a method for forming the same are disclosed, resulting in increased reliability of the semiconductor substrate including the gettering layer. The semiconductor device includes a semiconductor substrate; a gettering layer formed of a first-type impurity and a second-type impurity in the semiconductor substrate so as to perform gettering of metal ion; and a deep-well region formed over the gettering layer in the semiconductor substrate.

6 Claims, 21 Drawing Sheets

SEMICONDUCTOR DEVICE AND METHOD FOR FORMING THE SAME

CROSS-REFERENCE TO RELATED APPLICATION

The priority of Korean patent application No. 10-2013-0089666 filed on 29 Jul. 2013, the disclosure of which is hereby incorporated by reference in its entirety, is claimed.

BACKGROUND

Embodiments relate to a semiconductor device in which a gettering layer is formed in a semiconductor substrate and a method for forming the same, and more particularly to a technology for improving reliability of the semiconductor substrate including the gettering layer.

In recent times, semiconductor devices have been rapidly developed to implement higher speed, higher integration, and lower production costs. In order to implement higher integration and lower production costs of semiconductor devices, a technology for increasing the integration degree of semiconductor devices through Multi Chip Package (MCP) or System In Package (SIP) in a packaging process of the semiconductor devices, has been widely used in various technical fields. For example, MCP or SIP semiconductor devices, in which multiple semiconductor chips are stacked through at least 9 stages, have been mass produced.

However, there is a need to develop a technology for integrating 10 to 20 semiconductor chips. For such multi-layered packaging, a thickness of a semiconductor substrate including a semiconductor device should be greatly reduced. Also, there is a demand of developing light-weight and high-integration semiconductor devices for mobile communication. MCP or SIP-shaped semiconductor devices are also called on to meet such demands. To fabricate MCP or SIP-shaped semiconductor devices, there is a need to fabricate a semiconductor chip having a thinner thickness. In early 2000's, a semiconductor device was been fabricated to have a thickness of 200~150 µm. In recent semiconductor fabrication processes, a thickness of the recent semiconductor device is gradually reduced to about 60 µm, and it is expected that a thickness of the semiconductor device will be reduced to 60 µm or less in future.

However, a thinner substrate may encounter unexpected issues. The thinner substrate includes a gettering zone configured to capture a pollution source (e.g., metal ion) generated in a semiconductor fabrication process. Assuming that a substrate of the semiconductor device is fabricated to a thickness as thin as about 50 µm or less, there is little or no space to form the gettering zone. Thus, the gettering zone may be removed, deteriorating a gettering function.

SUMMARY

Various embodiments are directed to providing a semiconductor device and a method for forming the same that substantially obviate one or more issues that may be encountered in the related art.

An embodiment relates to a semiconductor device in which a gettering layer for gettering metal ions is formed in a semiconductor substrate using boron (B) ions and phosphorous (P) ions, such that resistance can be reduced and a leakage current is prevented from occurring, and a method for forming the semiconductor device.

In accordance with an aspect of the embodiment, a semiconductor device includes: a semiconductor substrate; a gettering layer including a first-type impurity and a second-type impurity in the semiconductor substrate and configured to getter metal impurity; and a deep-well region formed over the gettering layer and provided in the semiconductor substrate.

The first-type impurity includes P-type impurity and the second-type impurity includes N-type impurity.

The first-type impurity includes boron (B) and the second-type impurity includes phosphorous (P).

The deep-well region is formed by implantation of the second-type impurity.

The first-type impurity is implanted with high density.

The deep-well region is formed to partially overlap with the gettering layer.

In accordance with another aspect of the embodiment, a method for forming a semiconductor device includes: preparing a semiconductor substrate comprising a back side including a passivation layer and a denuded zone layer; forming a gettering layer including a first-type impurity and a second-type impurity in the denuded zone layer of the semiconductor substrate; and forming a deep-well region over the gettering layer.

The first-type impurity includes P-type impurity and the second-type impurity includes N-type impurity.

The first-type impurity includes boron (B) and the second-type impurity includes phosphorous (P).

The deep-well region is formed by implantation of the second-type impurity.

The method may further include: partially removing the denuded zone layer.

The method may further include: after the formation of the gettering layer, removing the passivation layer to expose the denuded zone layer.

The method may further include: after partially removing the denuded zone layer, forming the deep-well region in the denuded zone layer.

In accordance with another aspect of the embodiment, a method for forming a semiconductor device includes: forming a gettering layer including a first-type impurity and a second-type impurity over a back side of a semiconductor substrate; and forming a deep-well region over the gettering layer and provided in the semiconductor substrate.

The first-type impurity includes P-type impurity and the second-type impurity includes N-type impurity.

The first-type impurity includes boron (B) and the second-type impurity includes phosphorous (P).

The deep-well region is formed by implantation of the second-type impurity.

The forming the gettering layer includes: forming a single crystalline silicon layer over a back side of the semiconductor substrate; implanting the first-type impurity into the single crystalline silicon layer; and implanting the second-type impurity into the single crystalline silicon layer in which the first-type impurity is implanted.

The forming the gettering layer includes: providing the single crystalline silicon layer, in which the first-type impurity is implanted, over a back side of the semiconductor substrate; and implanting the second-type impurity into the single crystalline silicon layer in which the first-type impurity is implanted.

The forming the gettering layer includes: implanting the first-type impurity into the single crystalline silicon layer; implanting the second-type impurity into the single crystalline silicon layer; and providing the single crystalline silicon layer, in which the first-type impurity and the second-type impurity are implanted, over the back side of the semiconductor substrate.

In accordance with an aspect of the embodiment, a semiconductor device includes: a first well provided at a first level; and a gettering layer provided at a second level and including a first doping layer and a second doping layer, wherein the second doping layer comprises polarity opposite to the first doping layer, wherein the second level is deeper than the first level, the first doping layer and the second doping layer overlap at least partially.

The first well and the and the gettering layer are formed in a same semiconductor substrate.

The first well is formed in a first semiconductor substrate, and wherein the gettering layer is formed in a second semiconductor substrate.

The first well and the first doping layer have a same polarity.

The device further comprise a deep well provided at a third level between the first and the second level, wherein the deep well and the second doping layer have a same polarity.

A concentration of the first doping layer is higher than a concentration of the deep well.

A concentration of the second doping layer is higher than a concentration of the deep well.

The device further comprise second well provided at the first level, the second well has a polarity opposite to the first well.

The second doping layer is formed between the deep well and the first doping layer.

It is to be understood that both the foregoing general description and the following detailed description of embodiments are exemplary and explanatory and are not limitative.

DESCRIPTION OF EMBODIMENTS

Embodiments and examples will be described with reference to the accompanying drawings. Wherever possible, the same reference numbers will be used throughout the drawings to refer to the same or like parts. In the following description, a detailed description of related known configurations or functions incorporated herein will be omitted.

A semiconductor device according to embodiments sequentially implants N-type high-density boron (B) ion and P-type phosphorous (P) ion into a gettering layer, such that the high-density boron (B) ions are combined with phosphorous (P) ions, resulting in implementation of electrical neutralization. As a result, the above-mentioned semiconductor device can prevent a leakage current from occurring in an overlap between a deep-well region and a gettering layer.

A semiconductor device according to embodiments will hereinafter be described with reference to FIGS. 1 to 16.

Figure 1:
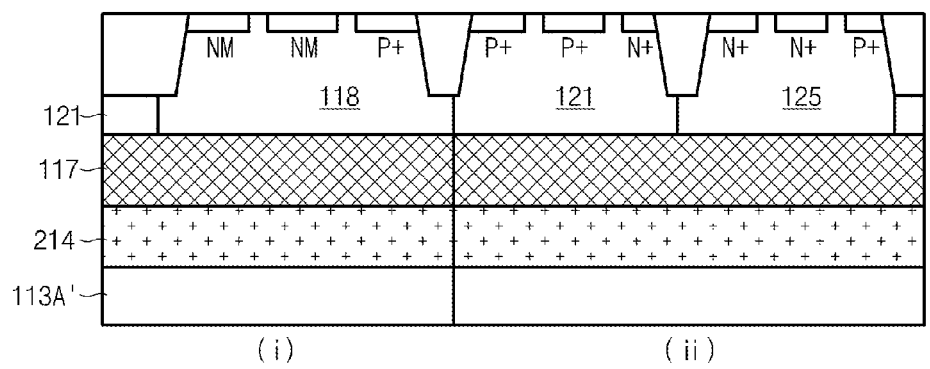
FIG. 1 is a cross-sectional view illustrating a semiconductor device according to an embodiment.

FIG. 1 is a cross-sectional view illustrating a semiconductor device according to an embodiment.

Referring to FIG. 1, the semiconductor according to the embodiment includes a gettering layer 214 formed over a denuded zone layer 113A' of a semiconductor substrate of a cell region (i) and a core region (ii). A deep-well region 117 is formed over the gettering layer 214. Nwell 121 and Cwell 118 are formed over the deep-well region 117 of the cell region (i). Nwell 121 and PRwell 125 are formed over the deep-well region 117 of the core region (ii). In this case, the gettering layer 214 is formed by an overlap of boron (B) ion and phosphorous (P) ion, and getters metal ions such as copper (Cu) ions.

Figure 2:
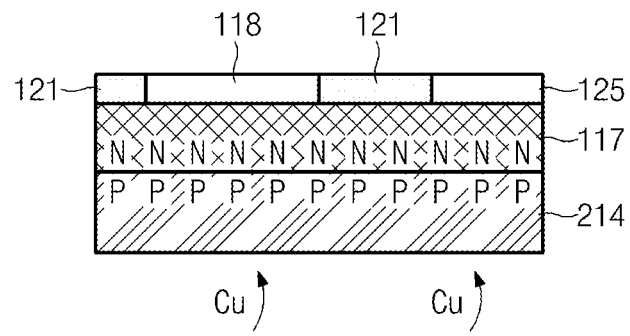
FIG. 2 is a cross-sectional view illustrating a semiconductor device in which low-density boron (B) ions are implanted into a gettering layer of FIG. 1.
Figure 3:
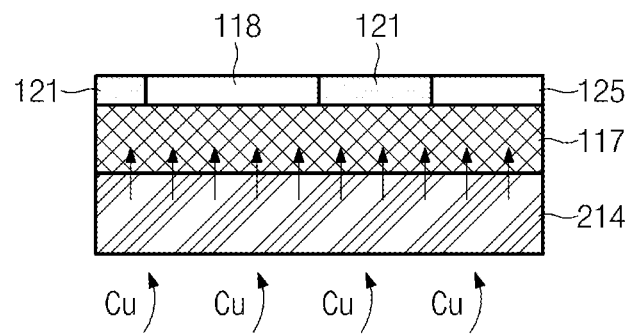
FIG. 3 is a cross-sectional view illustrating a semiconductor device in which high-density boron (B) ions are implanted into a gettering layer of FIG. 1.

When the low-density boron (B) ions are implanted into the gettering layer 214 as shown in FIG. 2, P-type boron (B) ions (or counter-doping) of the gettering layer 214 and N-type impurity ion of the deep-well region 117 come into contact with each other at an area between the gettering layer 214 and the deep-well region 117. Since the density of boron (B) ions implanted is low, an efficiency of gettering Cu-ion served by the gettering layer 214 is less.

Figure 4:
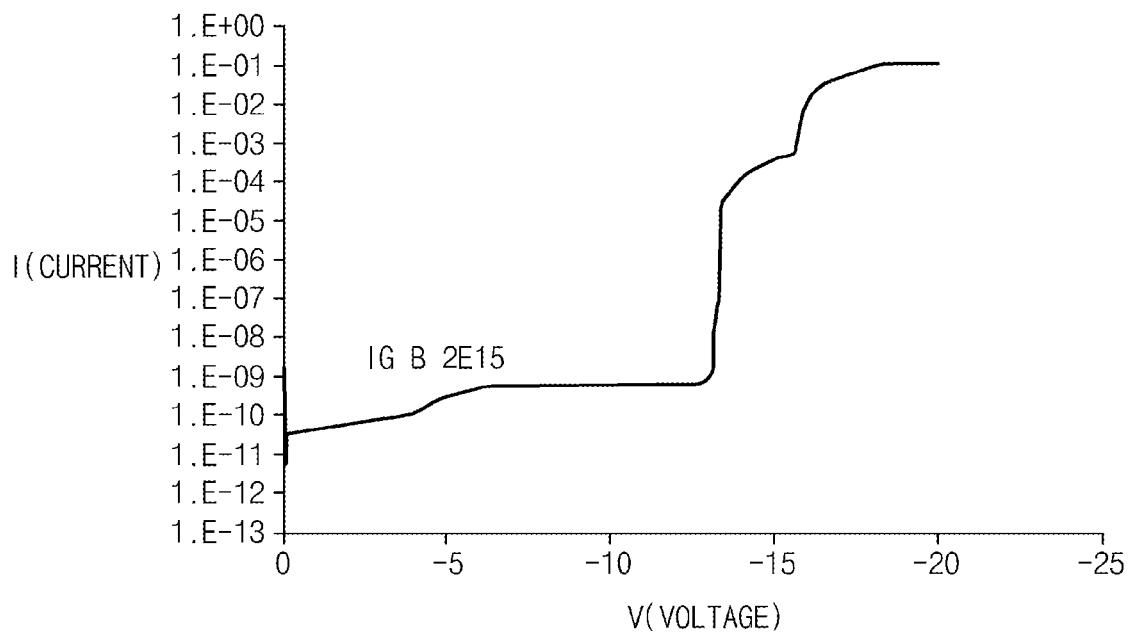
FIG. 4 is a graph illustrating a current variation generated when high-density boron (B) ions are implanted into the gettering layer of FIG. 3.

On the other hand, when high-density boron (B) ions are implanted into the gettering layer 214, at an area between the gettering layer 214 and the deep-well region 117, a density of P-type boron (B) ions becomes higher. Thus, a current path from the gettering layer 214 to the deep-well region 117 may be formed, resulting in formation of a leakage current. That is, since the density of boron (B) ions of the gettering layer 214 increases, a Cu-ion gettering function is strengthened, but a leakage current may occur. FIG. 4 is a graph illustrating a current variation generated when high-density boron (B) ions are implanted into the gettering layer shown in FIG. 3. As can be seen from FIG. 4, a current amount flowing in the deep-well region 117 increases during the implantation of high-density boron (B) ions.

Figure 5:
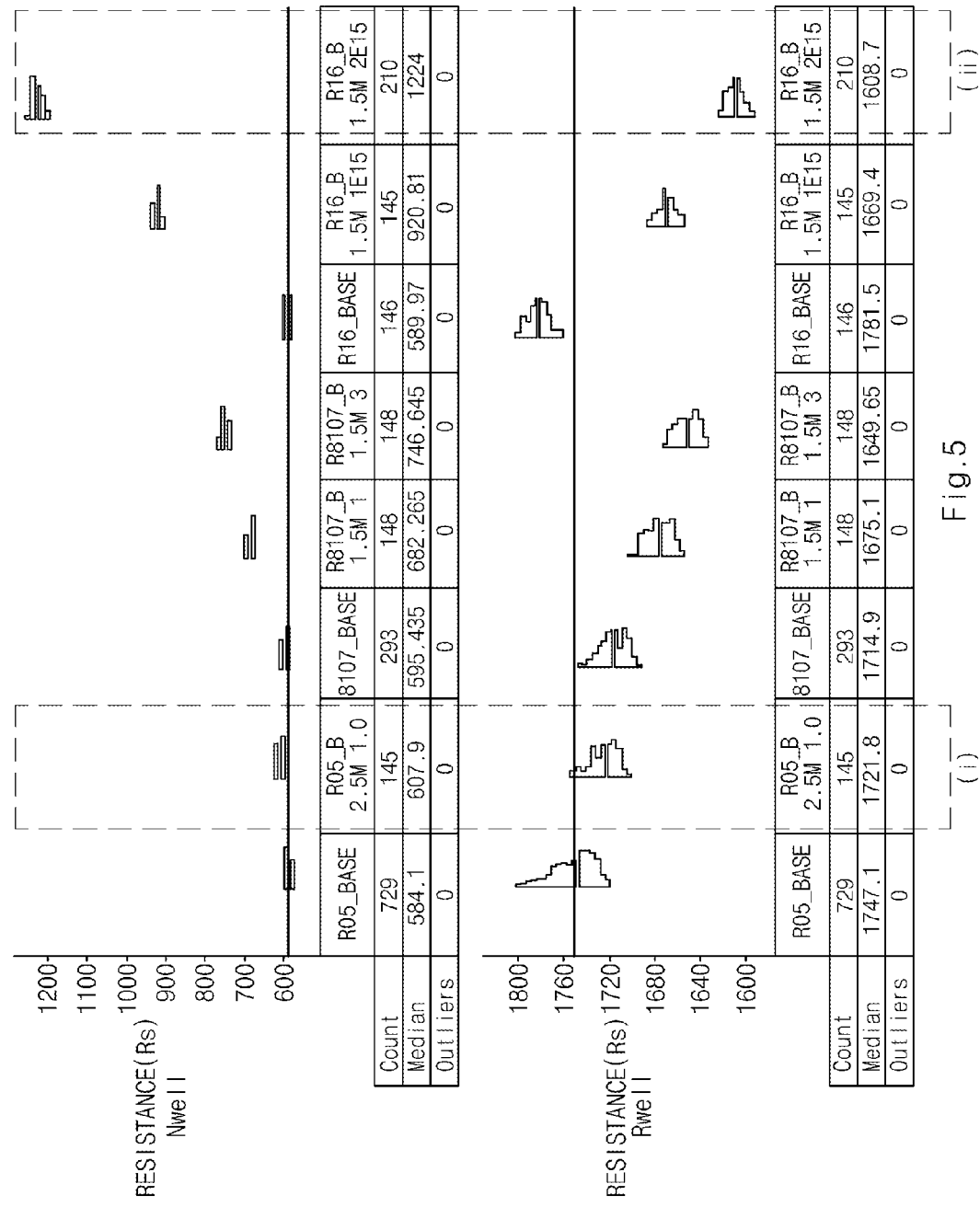
FIG. 5 is a conceptual diagram illustrating a resistance (Rs) variation caused by boron (B) ion implantation density of the gettering layer of FIG. 1.
Figure 6:
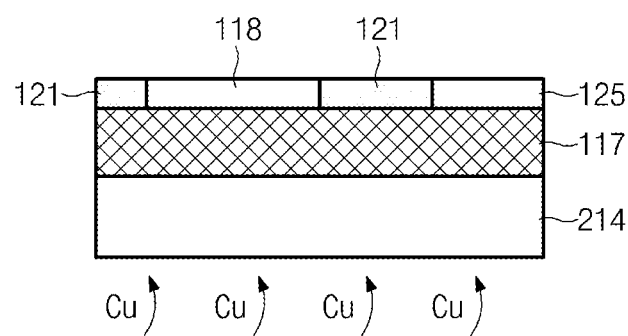
FIG. 6 is a cross-sectional view illustrating the semiconductor device in which boron (B) and phosphorous (P) ions are additionally implanted into the gettering layer of FIG. 1.
Figure 7:
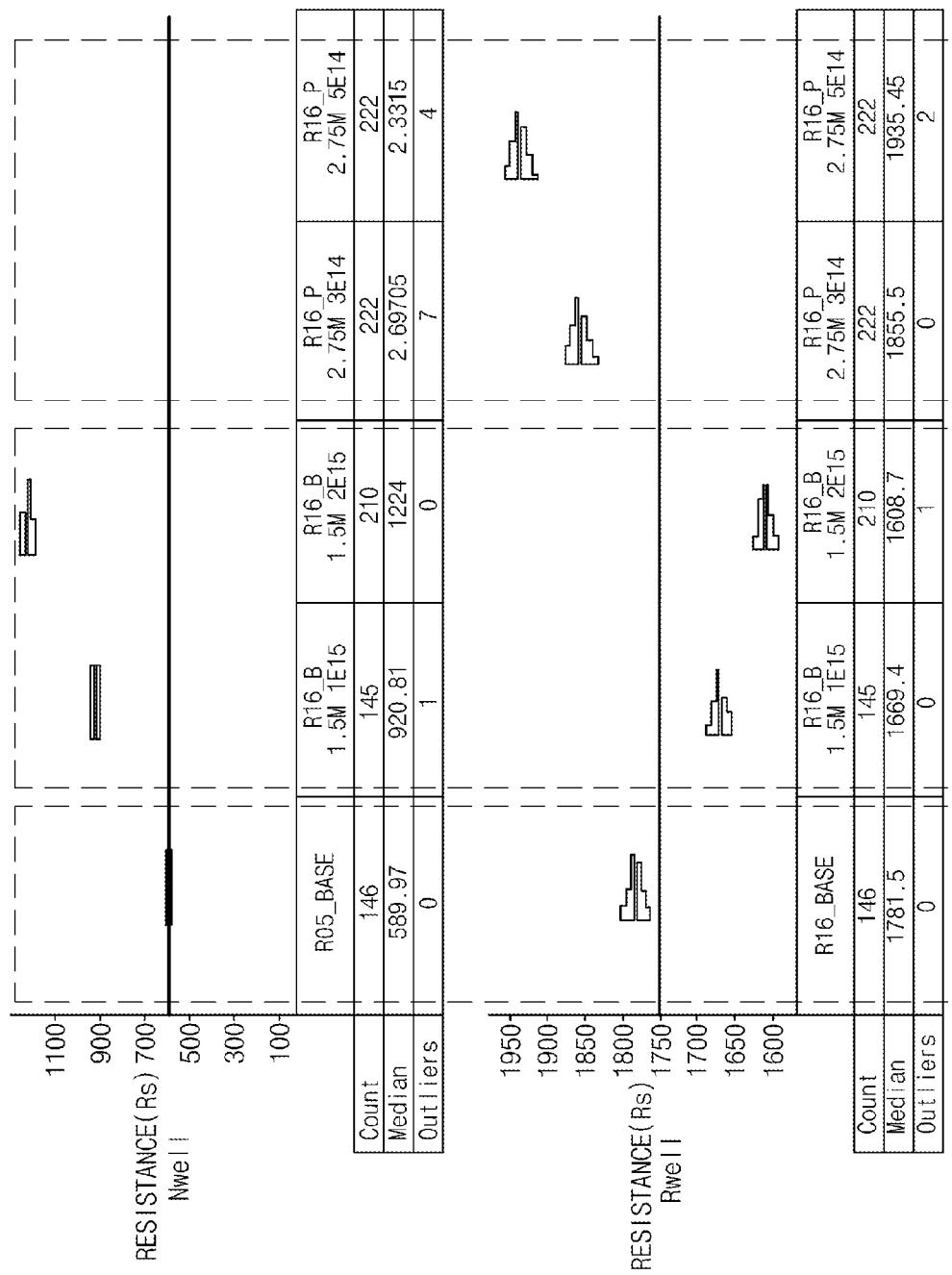
FIG. 7 is a conceptual diagram illustrating a resistance (Rs) variation generated when phosphorous (P) ions are additionally implanted into the gettering layer of FIG. 6.

FIG. 5 is a conceptual diagram illustrating a resistance (Rs) variation depending on boron (B) ion implantation density in the gettering layer of FIG. 1. FIG. 5 shows a resistance (Rs) variation depending on the density of boron (B) ion implantation into an extrinsic gettering layer of FIG. 2. In more detail, FIG. 5(i) shows low-density boron (B) ion implantation causing a lower resistance (Rs) value, and FIG. 5(ii)

shows high-density boron (B) ion implantation causing a higher resistance (Rs) value. Accordingly, when phosphorous (P) ions are additionally implanted into the gettering layer 214 after high-density boron (B) ions are implanted into the gettering layer 214, the Cu-ion gettering function is strengthened and at the same time a leakage current does not occur as shown in FIGS. 6-7 is a conceptual diagram illustrating a resistance (Rs) variation generated when additional phosphorous (P) ions are implanted into the gettering layer 214 which is formed by implantation of high-density boron (B) ions. In FIG. 7, (i) shows a resistance (Rs) value of the gettering layer 214 when neither boron (B) ions nor phosphorous (P) ions are implanted, (ii) shows a resistance (Rs) value of the gettering layer 214 when only boron (B) ions are implanted, and (iii) shows a resistance (Rs) value of the gettering layer 214 when both boron (B) ions and phosphorous (P) ions are implanted. As can be seen from FIG. 7, when both boron (B) and phosphorous (P) ions are implanted, the resistance (Rs) value obtained is lower as compared with when only boron (B) ions are implanted.

As described above, high-density boron (B) and phosphorous (P) ions are implanted into the gettering layer 214, the metal-ion gettering function can be strengthened and a leakage current can be prevented from occurring.

A method for forming a semiconductor device according to a first embodiment will hereinafter be described with reference to FIGS. 8A to 8F.

Figure 8A:
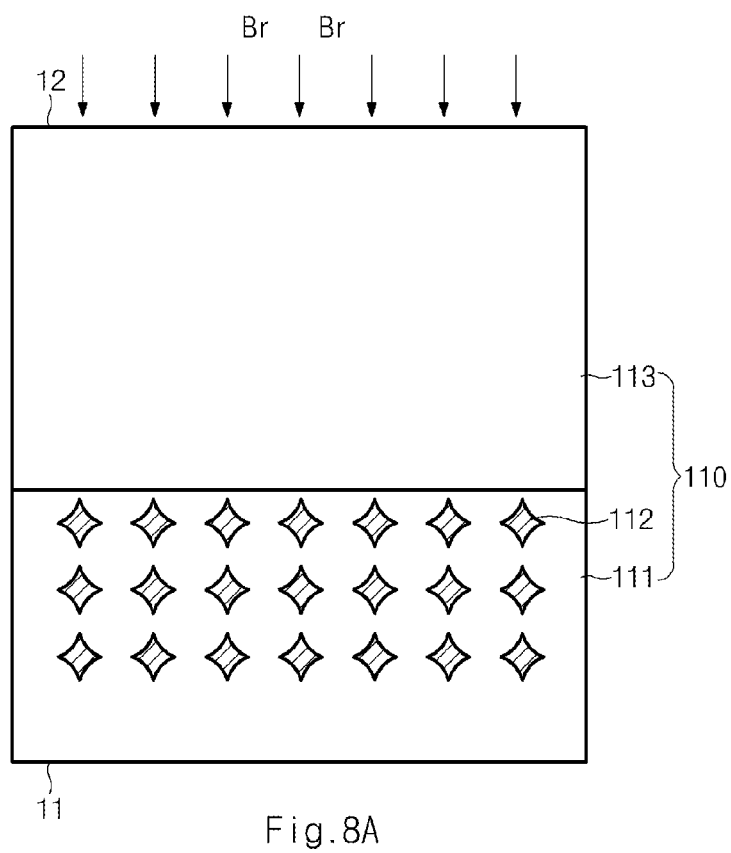
FIGS. 8A-8F are cross-sectional views illustrating a semiconductor device according to a first embodiment.
Figure 8B:
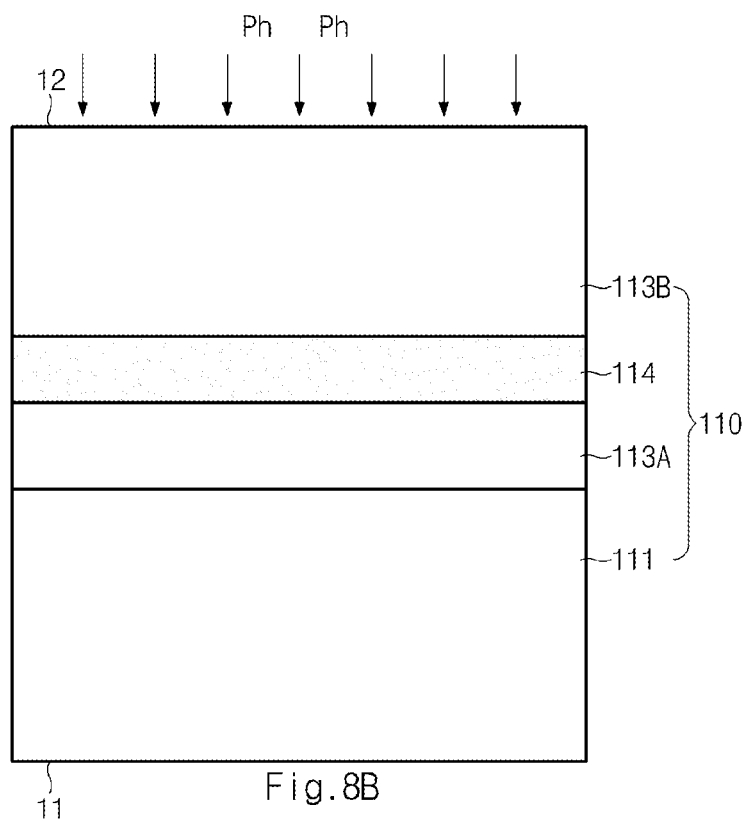

Referring to FIG. 8A, the semiconductor device includes a semiconductor substrate 110 in which a passivation layer 111 and a denuded zone layer 113 are sequentially stacked. In this case, the passivation layer 111 includes an internal micro defect 112 formed by oxygen. In this case, a total thickness of the semiconductor substrate 100 from a back side 11 of the passivation layer 111 to the uppermost part 12 of the denuded zone layer 113 may be about 350 µm. The passivation layer 111 may have a thickness of about 150 µm, and the denuded zone layer 113 may have a thickness of about 200 µm. Thereafter, boron (B) ions are implanted into a denuded zone layer 113 to form a gettering layer. Boron (B) ions may be implanted under various conditions (e.g., dose of 5E14, energy of 1.5 MeV, title of 3.5°, and twist of 112°). When boron (B) ions are implanted into the denuded zone layer 113 as described above, a B-ion implantation layer 114 is formed in the denuded zone layer 113 as shown in FIG. 8B, such that the denuded zone layer 113 is divided into two denuded zone layers (113A, 113B). Subsequently, phosphorous (P) ions are additionally implanted into the B-ion implantation layer 114 as shown in FIG. 8B, transforming the B-ion implantation layer 114 to a gettering layer 114A.

Figure 8C:
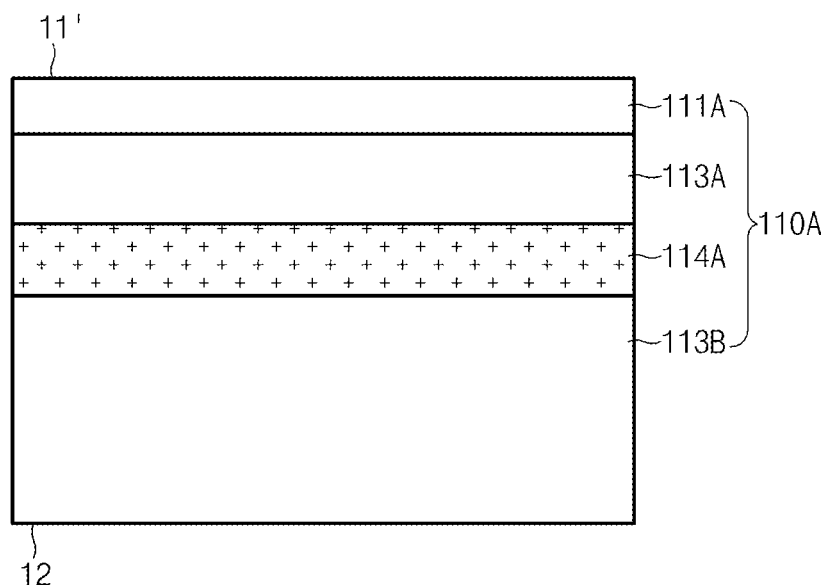

A gettering layer 114A to which phosphorous (P) ions are added is formed as shown in FIG. 8C. Therefore, electrons and holes of the boron (B) and phosphorous (P) ions are combined, and high-density boron (B) ions are electrically neutralized and polarities of the ions become disappear, such that a leakage current does not occur. In this case, the gettering layer 114A and wells 118, 121, 125 which are formed in a subsequent process (see FIG. 8F) may be formed together in a single semiconductor substrate.

In this case, phosphorous (P) ions may be implanted under various conditions (e.g., dose of 3E14, energy of 2.75 MeV, title of 3.5°, and twist of 112°). A profile of the implanted P ions may be as shown in 'B' of FIG. 9. As can be seen from FIG. 9, boron (B) and phosphorous (P) ions can be neutralized in an overlap region D between the B-ion implantation profile A and the P-ion implantation profile B.

When phosphorous (P) ions are additionally doped in the B-ion implantation layer 114, N-type phosphorous (P) ions neutralize high-density boron (B) ions, such that no leakage current occurs. Copper (Cu) ion gettering function can be properly achieved even in case where the boron (B) ions are neutralized.

Figure 8D:
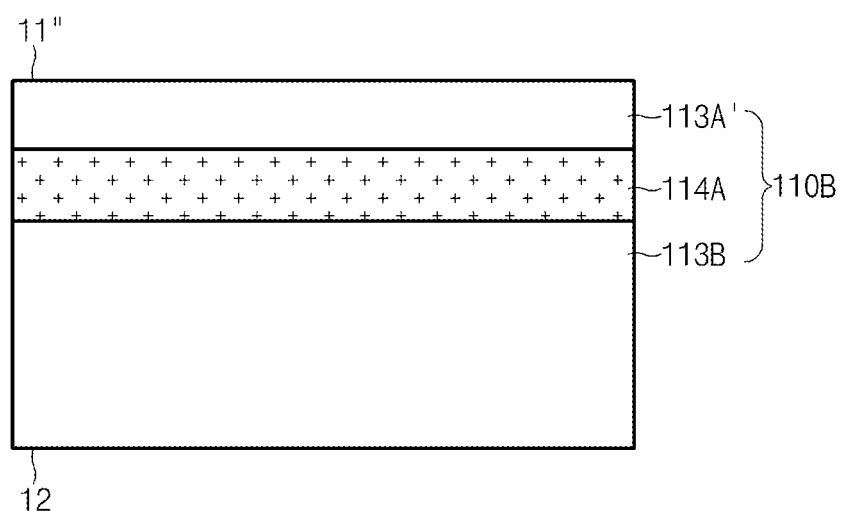

As can be seen from FIGS. 8C and 8D, the semiconductor substrate 110 is turned upside down so that the back side 11 becomes a top surface.

Referring to FIG. 8C, in order to reduce a total thickness of the semiconductor substrate 110, back-grinding is performed on the back side 11 such that the passivation layer 111 is reduced to a predetermined thickness. Accordingly, the semiconductor substrate 110A having a reduced thickness is formed, and a thinner passivation layer 111A remains on the back side 11' of the semiconductor substrate 110A. In this case, the back-grinding process is a thinning process for thinning the semiconductor substrate.

Thereafter, as shown in FIG. 8D, the entire passivation layer 111A and some portion of the denuded zone layer 113A are removed by a predetermined thickness so as to implement a stress relief process, resulting in a reduced thickness of the denuded zone layer 113A. Therefore, the semiconductor substrate 110B may have a very thin thickness which includes the remaining denuded zone layers (113A', 113B) and the combined gettering layer 114A.

Figure 8E:
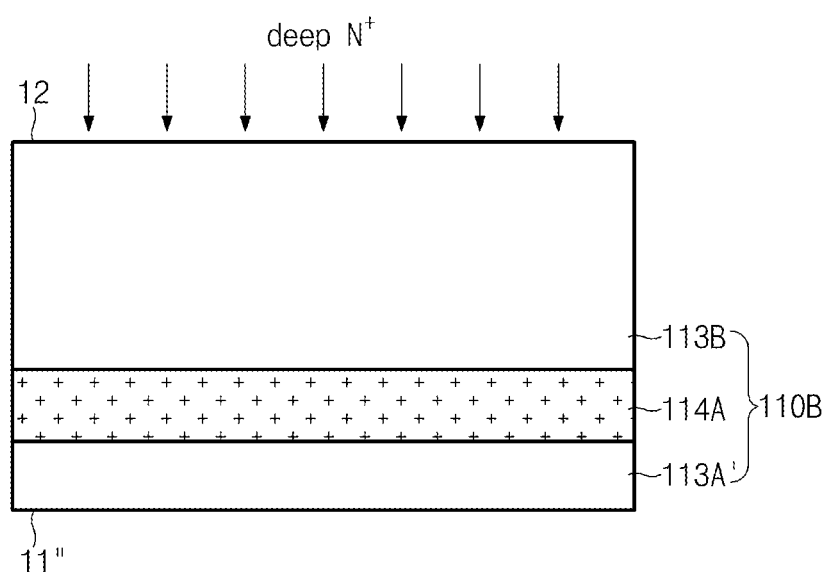

Subsequently, as can be seen from FIGS. 8E and 8F, the semiconductor substrate 110B is turned upside down again, such that the back side 11" of the semiconductor substrate 110B again faces bottom and the top surface 12 thereof faces upward. Thereafter, DNWell ion implantation is performed on the denuded zone layer 113A' into the semiconductor substrate 110B.

Figure 8F:
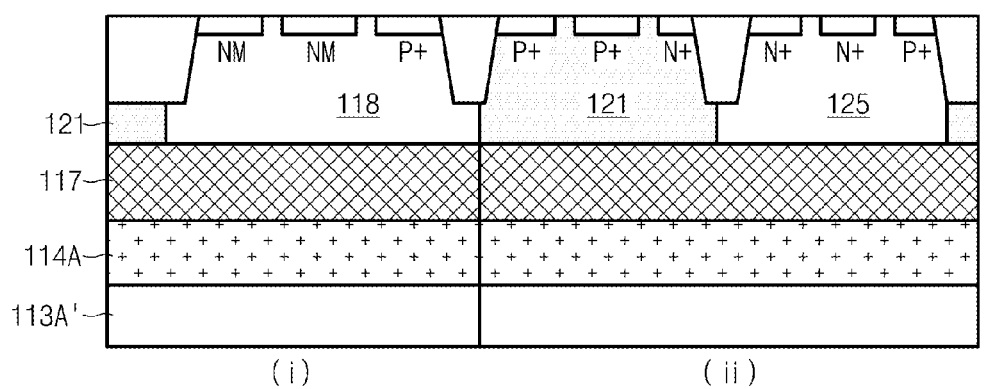
Figure 9:
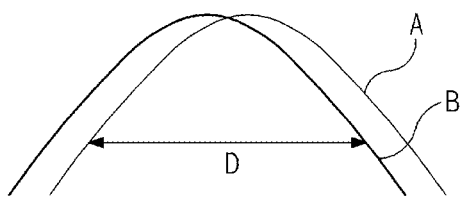
FIG. 9 shows an ion-implantation doping profile according to an embodiment.

Consequently, a deep-well region 117 is formed to contact the gettering layer 114A as shown in FIG. 8F. In this case, the deep-well region 117 may be formed to overlap some portions of the lower gettering layer 114A. In addition, N-type impurity for forming the deep-well region 117 may include phosphorous (P) ions. Here, the phosphorous (P) ions may be implanted under particular conditions (e.g., dose of 1.4E13, energy of 1.0 MeV, tilt of 3.5°, and twist of 112°). Thereafter, P-type impurity ions may be implanted at an implantation energy of 300 KeV into a cell-array formation region using a first photoresist pattern (not shown) as a mask, resulting in formation of the Cwell 118. Subsequently, N-type impurity ions may be implanted at an implantation energy of 300 KeV into a formation region of a transistor such as PMOS using a second photoresist pattern (not shown) as a mask, resulting in formation of the Nwell 121. Thereafter, P-type impurity ions are implanted at an implantation energy of 300 KeV using a third photoresist pattern 123 as a mask, such that a PRwell 125 is formed in a formation region of the NMOS transistor. A method for forming the semiconductor device according to a second embodiment will hereinafter be described with reference to FIGS. 10A to 10E. In accordance with another embodiment, an extrinsic gettering layer to which high-density boron (B) and phosphorous (P) ions are added is additionally formed.

A semiconductor substrate 110 in which the passivation layer 111 and the denuded zone layer 113 are sequentially stacked, is formed as shown in FIG. 8A depicting the first embodiment.

Figure 10A:
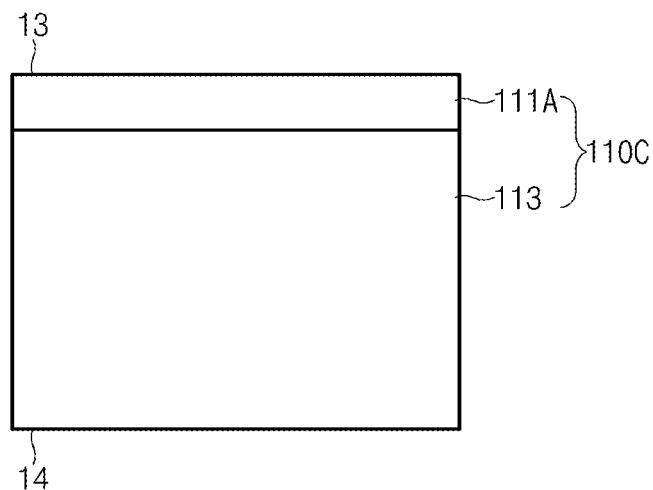
FIGS. 10A-10E are cross-sectional views illustrating a semiconductor device according to a second embodiment.

Referring to FIG. 10A, back grinding is performed against the back side 13 so as to reduce a total thickness of the semiconductor substrate 110, such that the semiconductor substrate 110 is removed by a predetermined thickness. Therefore, a semiconductor substrate 110C having a reduced thickness is formed, and a passivation layer 111A having a thin thickness remains on the back side 13 of the semiconductor substrate 110C.

Figure 10B:
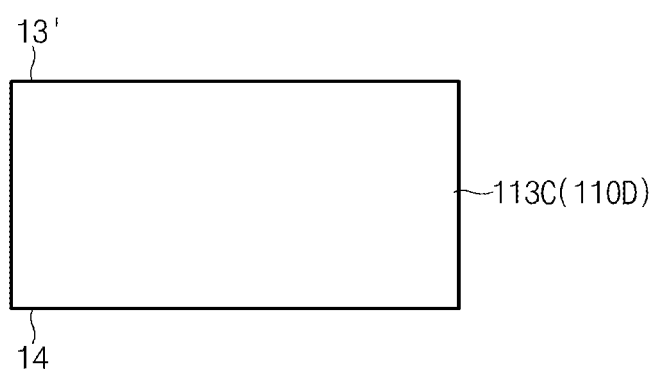
Figure 10C:
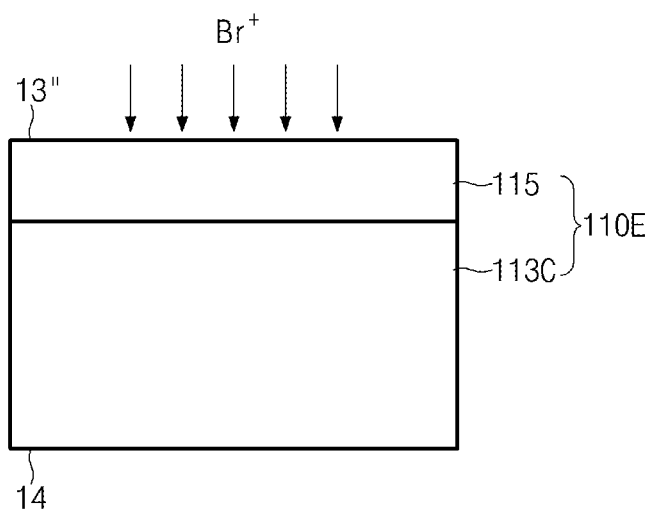
Figure 10D:
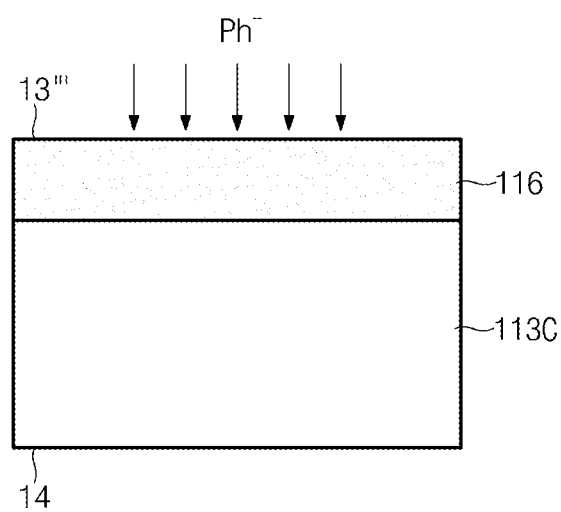

As can be seen from FIGS. 10B to 10D, the semiconductor substrate 110 is turned upside down in a manner that the back side 13' becomes a top surface and the top surface 14 becomes a bottom surface.

Referring to FIG. 10B, the entire passivation layer 111A and some portions of the denuded zone layer 113 are additionally removed by a predetermined thickness so as to implement a stress relief process. Accordingly, only the denuded zone layer 113C remains on the semiconductor substrate 110D, such that the semiconductor substrate 110D may have a very thin thickness.

Referring to FIG. 10C, a single crystalline silicon layer 115 as an extrinsic gettering layer is provided over the back side 13" of the semiconductor substrate 110D in which the denuded zone layer 113C remains. Therefore, a semiconductor substrate 110E may have a stacked structure including the denuded zone layer 113C and the single crystalline silicon layer 115. Here, boron (B) ions are not implanted into the single crystalline silicon layer 115. Thereafter, boron (B) ions are doped into the single crystalline silicon layer 115 an extrinsic gettering layer 116 over the back side 13''' of the semiconductor substrate, as shown in FIG. 10D.

Figure 10E:
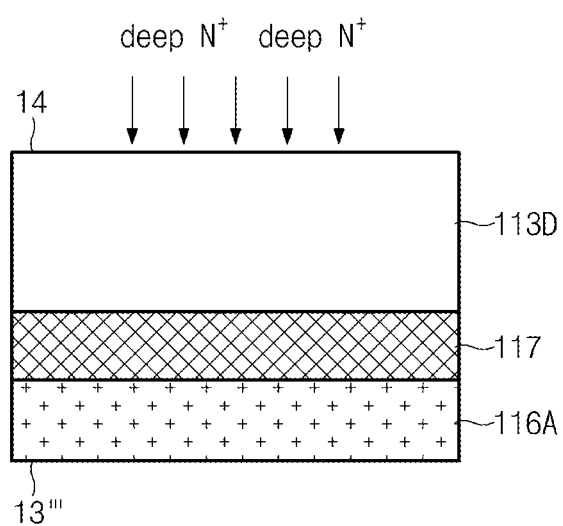

Subsequently, as shown in FIG. 10D, phosphorous (P) ions are doped into the extrinsic gettering layer 116 in which boron (B) ions are implanted, such that a gettering layer 116A is formed as shown in FIG. 10E. In this case, electrons and holes of the boron (B) and phosphorous (P) ions are combined, and high-density boron (B) ions are electrically neutralized and polarities of the ions disappear, such that a leakage current can be prevented. That is, N-type phosphorous (P) ions neutralize high-density P-type boron (B) ions, such that leakage current can be prevented. Copper (Cu) ion gettering function can be maintained even when the boron (B) ions are neutralized.

Thereafter, as shown in FIG. 10E, the semiconductor substrate is turned upside down again, such that the top surface 14 faces upward and the back side 13''' becomes a bottom surface. That is, after the semiconductor substrate is turned over in a manner that the denuded zone layer 113C becomes the top surface 14, DNwell ions are implanted into the denuded zone layer 113C, resulting in formation of a deep-well region 117. In this case, the deep-well region 117 may be formed to overlap some portions of the lower extrinsic gettering layer 116A. The denuded zone layer 113D for forming Nwell and PRwell may remain on the deep-well region 117. Thereafter, in the same manner as shown in FIG. 8F, the Cwell 118 is formed by implantation of P-type impurity ion, the Nwell 121 is formed by implantation of N-type impurity ion, and the PRwell 125 is formed in a formation region of the NMOS transistor by implantation of P-type impurity ion. FIGS. 10C and 10D describe examples in which the single crystalline silicon layer 115 is deposited over the denuded zone layer 113C, and boron (B) ion and phosphorous (P) ion are sequentially implanted to form a gettering layer 116A. However, as the extrinsic getter layer 116, a pre-doped single crystalline silicon layer 115 can be used. For example, a single crystalline silicon layer 115 doped with the boron (B) ion may be deposited or attached as shown in FIGS. 11A and 11B showing a third embodiment.

Figure 11A:
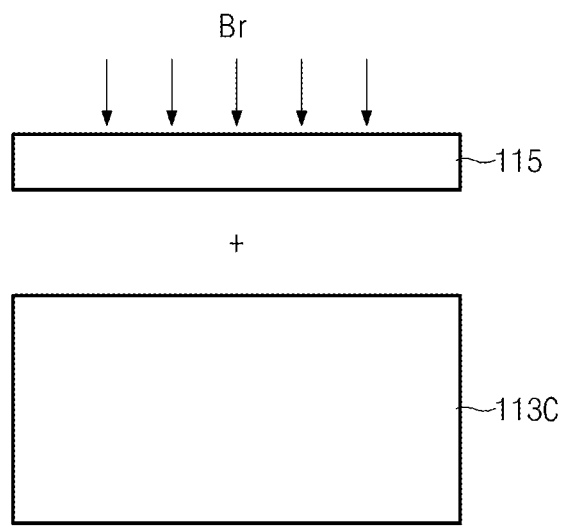
FIGS. 11A and 11B are cross-sectional views illustrating a semiconductor device according to an embodiment.
Figure 11B:
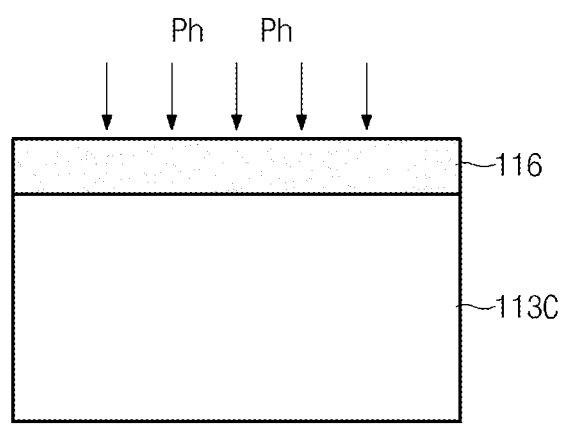

In other words, after boron (B) ions are implanted into a separate single crystalline silicon layer 115 so as to form an extrinsic gettering layer 116 as shown in FIG. 11A, the extrinsic gettering layer 116 may be deposited or attached over the denuded zone layer 113C. Thereafter, as shown in FIG. 11B, phosphorous (P) ions are implanted into the extrinsic gettering layer 116 deposited over the denuded zone layer 113C, resulting in formation of a gettering layer 116A. In this case, for gettering of metal ion such as copper (Cu) ion, instead of the single crystalline silicon layer 115, a single-silicon layer doped with high-density boron ions may be employed. The single-silicon layer doped with high-density boron ions may have a thickness of at least 5 µm, such that the extrinsic gettering effect can be maximized.

Figure 12A:
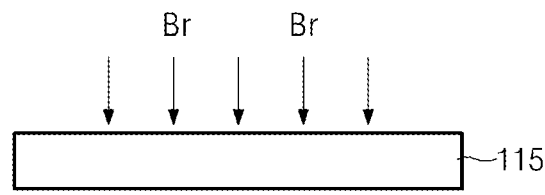
FIGS. 12A-12C are cross-sectional views illustrating a semiconductor device according to an embodiment.
Figure 12B:
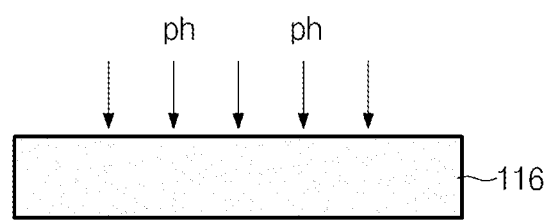
Figure 12C:
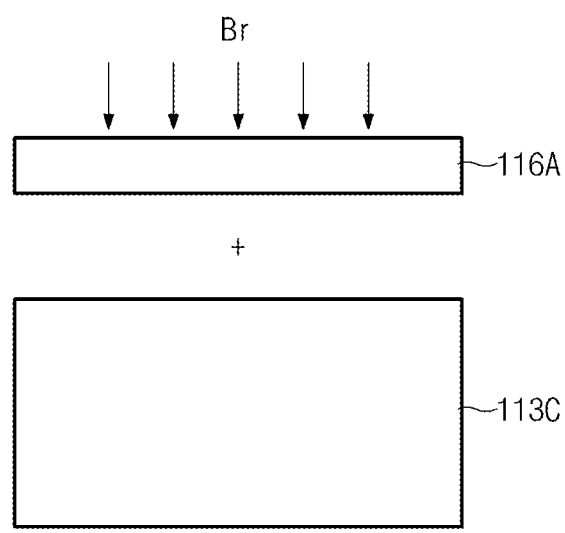

Referring to FIGS. 12A to 12C showing a fourth embodiment, boron (B) ions are implanted into the single crystalline silicon layer 115 as shown in FIG. 12A. Phosphorous (P) ions are additionally implanted as shown in FIG. 12B to a gettering layer 116A. The gettering layer 116A in which boron (B) and phosphorous (P) ions are implanted may be deposited or attached over the back side of the denuded zone layer 113C.

As described above, phosphorous (P) ions are additionally implanted into the B-ion implantation region used as a gettering layer, such that boron (B) ions are captured. As a result, a leakage current which might generate when the B-ion implantation region overlaps with the deep-well region 117 is prevented from occurring, and gettering characteristics of the B-ion implantation region can be maintained.

Figure 13:
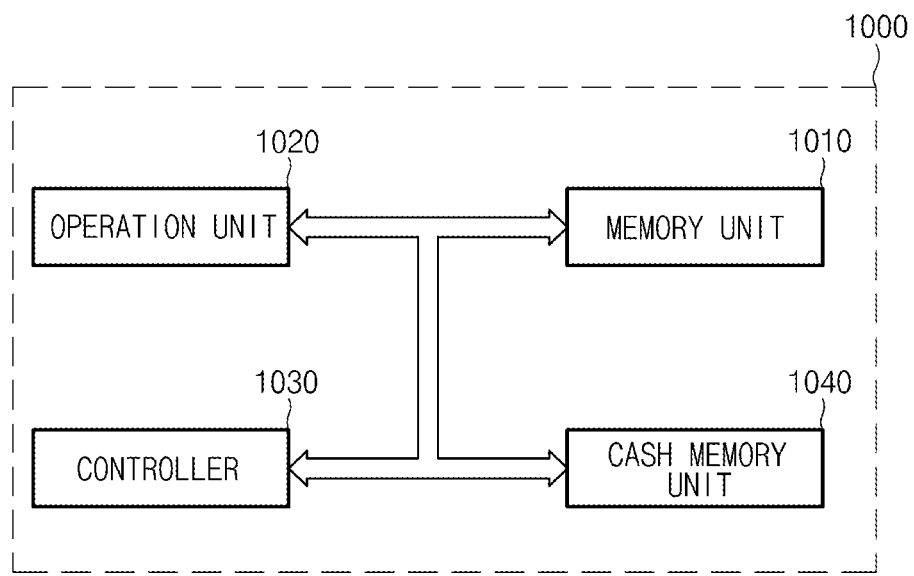
FIG. 13 is a block diagram illustrating a microprocessor according to an embodiment.

FIG. 13 is a block diagram illustrating a microprocessor 1000 according to an embodiment. Referring to FIG. 13, the microprocessor 1000 may be configured to control and adjust a series of operations for receiving data from various external devices and outputting the processed result to the external devices. The microprocessor 1000 serving as a semiconductor device may include a memory unit 1010, an operation unit 1020, and a controller 1030, each of which includes logic elements, for example, various gates implemented by a combination of transistors formed over the semiconductor substrate, flip-flops, etc. The microprocessor 1000 may include a variety of data processors, for example, a Central Processing Unit (CPU), a Graphic Processing Unit (GPU), a Digital Signal Processor (DSP), an Application Processor (AP), etc.

The memory unit 1010 serving as a processor register or a register is contained in the microprocessor 1000 to store data, may include a data register, an address register, and a floating-point register, and may include a variety of registers. The memory unit 1010 may temporarily store either data requisite for calculation of the operation unit 1020 or execution resultant data, and may store an address in which data for execution is stored.

The operation unit 1020 is configured to perform internal operation of the microprocessor 1000, and performs various four fundamental arithmetic operations or a logic operation according to the result obtained by command interpretation of the controller 1030. The operation unit 1020 may include one or more Arithmetic and Logic Units (ALUs).

The controller 1030 may receive signals from the memory unit 1010, the operation unit 1020, the microprocessor 1000, and other external devices, and may perform various control operations such as command extraction, command analysis, and command input/output, etc. such that processes written by programming can be carried out.

The microprocessor 1000 may include a through silicon via (TSV) to communicate with various external devices at high speed. The TSV may be directly or indirectly coupled to the controller 1030, the memory unit 1010, and the operation unit 1020. In accordance with the aforementioned embodiments, the semiconductor substrate may include a gettering layer and a deep-well region. Here, the gettering layer is formed of a first-type impurity and a second-type impurity so as to perform metal-ion gettering, and the deep-well region is formed over the gettering layer of the semiconductor substrate. The microprocessor 100 according to the embodiment includes the gettering layer formed over the semiconductor substrate, such that reliability of a TSV structure can be improved and the microprocessor 1000 having high reliability can operate at a high speed.

The microprocessor 1000 according to the embodiment may include not only the memory unit 1010 but also a cache memory unit 1040 for receiving data from an external device or temporarily storing data to be output to the external device. In this case, the microprocessor 1000 may communicate with the memory unit 1010, the operation unit 1020, and the controller 1030 through a bus interface 1050. In addition, the cache memory unit 1040 may be electrically coupled to the TSV.

Figure 14:
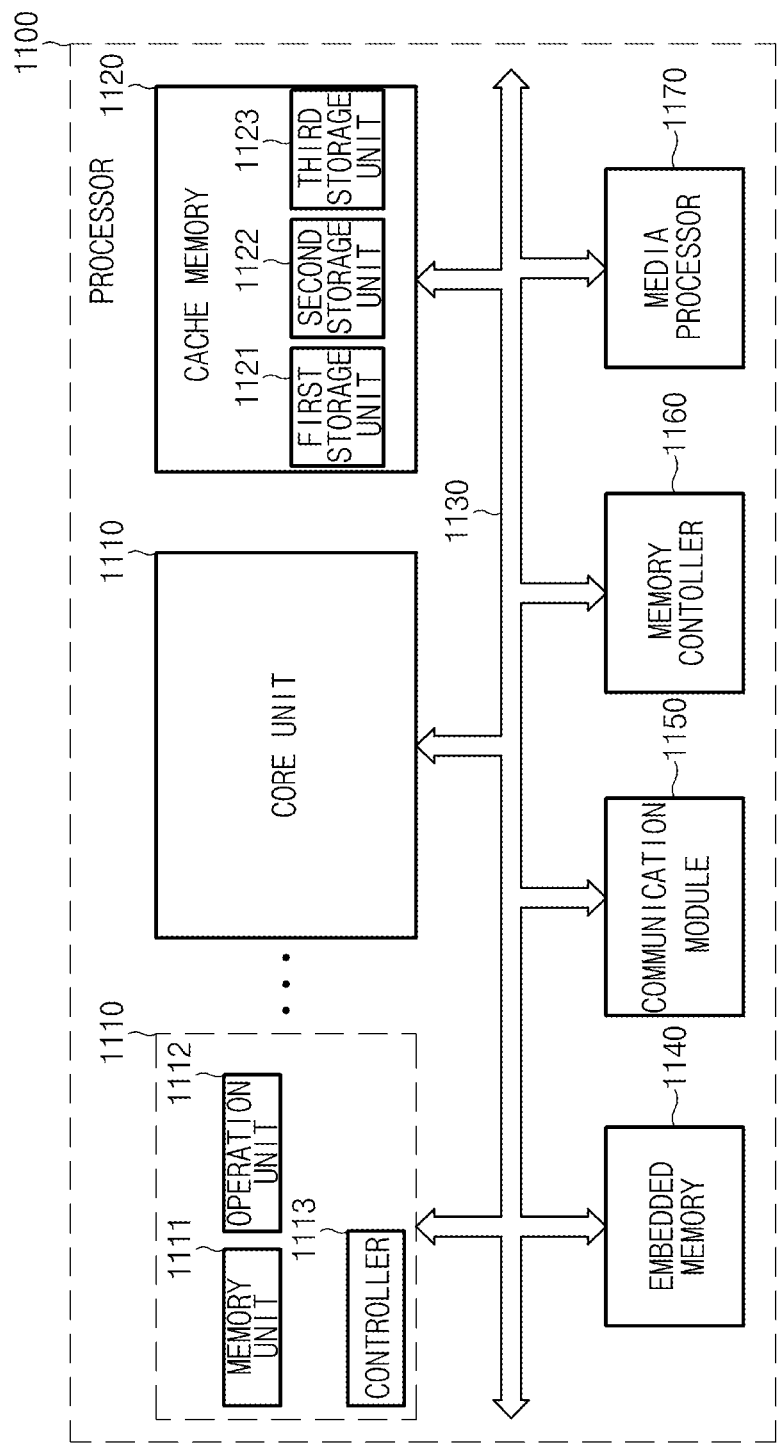
FIG. 14 is a block diagram illustrating a processor according to an embodiment.

FIG. 14 is a block diagram illustrating a processor 1100 according to an embodiment.

Referring to FIG. 14, the processor 1100 may include various logic elements, for example, gates implemented by a combination of transistors formed over a semiconductor substrate, flip-flops, etc. The processor 1100 may include a microprocessor configured to control and adjust a series of operations for receiving data from various external devices and outputting the processed result to the external devices, and may include a variety of functions, such that throughput improvement and multi-functional characteristics can be implemented. The processor 1100 may include a core unit 1110 serving as a microprocessor, a cache memory unit 1120 for temporarily storing data, and a bus interface 1130 for data communication between internal and external devices. The processor 1100 may be a variety of system on chips (SoCs) such as a Multi Core Processor (MCU), a Graphic Processing Unit (GPU), an Application Processor (AP), etc.

The core unit 1110 according to the embodiment is used as an arithmetic/logic operator of data received from an external device, and may include a memory unit 1111, an operation unit 1112, and a controller 1113. The memory unit 1111 may function as a processor register or a register. The memory unit 1111 is contained in the processor 1110 to store data, may include a data register, an address register, a floating-point register, etc. and may also include a variety of registers. The memory unit 1111 may temporarily store either data requisite for calculation of the operation unit 1112 or execution resultant data, and may store an address in which data for execution is stored. The operation unit 1112 is configured to perform internal operation of the processor 1100, and performs various four fundamental arithmetic operations or a logic operation according to the result obtained by command interpretation of the controller 1113. The operation unit 1112 may include one or more Arithmetic and Logic Units (ALUs). The controller 1113 may receive signals from the memory unit 11111, the operation unit 1112, the processor 1110, and other external devices, and may perform various control operations such as command extraction, command analysis, and command input/output, etc. such that processes written by programming can be carried out.

Unlike the core unit 1110 operating at high speed, the cache memory unit 1120 may temporarily store data to compensate for a difference between data processing speeds of a low-speed external device, and may include a first storage unit 1121, a second storage unit 1122, and a third storage unit 1123. Generally, the cache memory unit 1120 includes the first storage unit 1121 and the second storage unit 1122. If the cache memory unit 1120 needs to have high capacity, it may further include the third storage unit 1123. If necessary, the cache memory unit 1120 may further include many more storage units. That is, the number of storage units contained in the cache memory unit 1120 may be differently established according to a variety of designs. In this case, the first, second, and third storage units (1121, 1122, 1123) may have the same or different data storage and distinction processing speeds. If the first to third storage units (1121, 1122, 1123) have different processing speeds, the first storage unit 1121 may have the highest speed.

Although the first, second, and third storage units (1121, 1122, 1123) are configured in the cache memory unit 1120 as shown in FIG. 14, the first to third storage units (1121, 1122, 1123) of the cache memory unit 1120 may be located outside of the core unit 1110, and it is possible to compensate for a difference in processing speed between the core unit 1110 and the external device. In addition, the first storage unit 1121 of the cache memory unit 1120 may be located inside of the core unit 1110, and the second and third storage units (1122, 1123) may be located outside of the core unit 1110, such that the function for compensating for the processing speed can be more emphasized. On the contrary, the first storage unit 1121 and the second storage unit 1122 of the cache memory unit 1120 may be located inside the core unit 1110, and the third storage unit 1123 may be located outside the core unit 1110.

A bus interface 1130 couples the core unit 1110 to the cache memory unit 1120, such that data can be more efficiently transmitted through the bus interface 1130.

The processor 1100 according to the embodiment may include a plurality of core units 1110, and a plurality of core units 1110 may share the cache memory unit 1120. The core units 1110 may be coupled to the cache memory unit 1120 through the bus interface 1130. The plurality of core units 1110 may be identical in structure to the above-mentioned core units. If the processor 1100 includes the core units 1110, the first storage unit 1121 of the cache memory unit 1120 may be configured in each core unit 1110 in correspondence to the number of core units 1110, the second storage unit 1122 and the third storage unit 1123 may be integrated into one storage unit, and the integrated storage unit may be located outside the plurality of core units 1110 and be shared by an external bus interface 1130. Here, the processing speed of the first storage unit 1121 may be higher than that of the second or third storage unit 1122 or 1123. On the contrary, the first storage unit 1121 and the second storage unit 1122 may be configured in each core unit 1110 in correspondence to the number of core units 1110, the third storage unit 1123 may be located outside the plurality of core units 1110 and be shared by an external bus interface 1130.

The processor 1100 according to the embodiment may further include an embedded memory 1140 for storing data; a communication module 1150 for transmitting/receiving data to/from an external device by wire or wirelessly; a memory controller 1160 for driving an external memory device; and a media processor 1170 for processing either data processed by the processor 1100 or input data received from the external input device, and outputting the processed data to the external interface device. Besides the above constituent elements, the processor 1100 may further include a plurality of modules or devices. In this case, the added modules may transmit/receive data to/from the core unit 1110 and the cache memory 1120 through the bus interface 1130.

The embedded memory 1140 may include a non-volatile memory and a volatile memory. The volatile memory may include a Dynamic Random Access Memory (DRAM), a Mobile DRAM, a Static Random Access Memory (SRAM), etc., and may also include other similar memories. The non-volatile memory may include a Read Only Memory (ROM), a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc., and may also include other similar memories.

The communication module 1150 may include a module coupled to a wired network and a module coupled to a wireless network. The wired network module may include a Local Area Network (LAN), a Universal Serial Bus (USB), an Ethernet, a Power Line Communication (PLC), etc. The wireless network module may include a variety of devices for data communication without using a transfer line. For example, the wireless network module may include Infrared Data Association (IrDA), Code Division Multiple Access (CDMA), Time Division Multiple Access (TDMA), Frequency Division Multiple Access (FDMA), Wireless LAN (WLAN), Zigbee, Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), etc.

The memory controller 1160 may manage transmission data between the processor 1100 and external storage devices operated according to different communication standards, and may include a variety of memory controllers and a controller. Here, the controller may control Integrated Device Electronics (IDE), Serial Advanced Technology Attachment (SATA), Small Computer System Interface (SCSI), Redundant Array of Independent Disks (RAID), Solid State Disc (SSD), External SATA (eSATA), Personal Computer Memory Card International Association (PCMCIA), Universal Serial Bus (USB), Secure Digital (SD), mini Secure Digital card (mSD), micro SD, Secure Digital High Capacity (SDHC), Memory Stick Card, Smart Media Card (SM), Multi Media Card (MMC), Embedded MMC (eMMC), Compact Flash (CF), etc.

The media processor 1170 may include a Graphics Processing Unit (GPU), a Digital Signal Processor (DSP), a High Definition Audio (HD Audio), a High Definition Multimedia Interface (HDMI) controller, etc., which are configured to fabricate data processed by the processor 1100 and input data received from an external input device in such a manner that the fabricated data is configured in the form of audio, video, and other data and transferred to the external interface device.

The processor 1100 may include a through silicon via (TSV) formed over a semiconductor substrate so as to communicate with various external devices at high speed, differently from various structures such as the core unit 1110, the cache memory unit 1120, the bus interface 1130, etc. The processor 1100 may include a plurality of TSVs, and may be directly or indirectly coupled to the core unit 1110, the cache memory unit 1120, the bus interface 1130, etc. In accordance with the aforementioned embodiments, the semiconductor substrate may include a gettering layer and a deep-well region. Here, the gettering layer is formed of a first-type impurity and a second-type impurity so as to perform metal-ion gettering, and the deep-well region is formed over the gettering layer of the semiconductor substrate. The microprocessor 100 according to the embodiment includes the gettering layer formed over the semiconductor substrate, such that reliability of a TSV structure can be improved and the microprocessor 1000 having high reliability can operate at a high speed.

Figure 15:
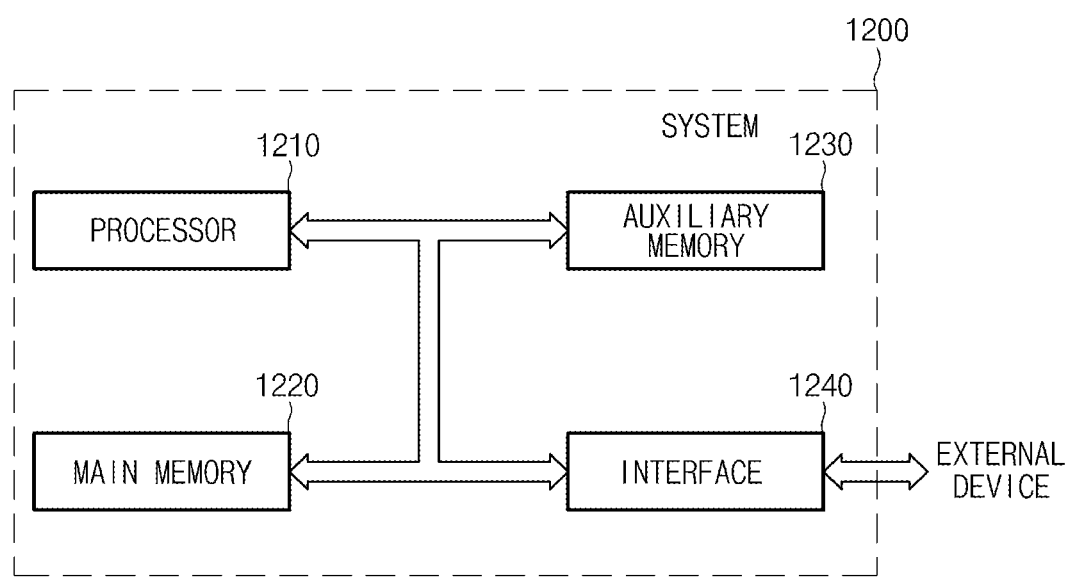
FIG. 15 is a block diagram illustrating a system according to an embodiment.

FIG. 15 is a block diagram illustrating a system 1200 according to an embodiment.

Referring to FIG. 15, the system 1200 serving as a data processor may perform a variety of operations such as input, processing, output, communication, and storing actions, and may include a processor 1210, a main memory unit 1220, an auxiliary memory unit 1230, and an interface unit 1240. The system according to the embodiment may be any one of a variety of electronic systems operated by a variety of processes, for example, a computer, a server, a Personal Digital Assistant (PDA), a Portable Computer, a Web Tablet, a Wireless Phone, a mobile phone, a smart phone, a digital music player, Portable Multimedia Player (PMP), a camera, a Global Positioning System (GPS), a video camera, a voice recorder, a Telematics, an Audio Visual (AV) System, a Smart Television, etc.

The processor 1210 may interpret a command stored therein and a command received from an external part, may perform various processes such as calculation, comparison, etc. of external input data of the system 1200, and data stored in the main memory unit 1220 or the auxiliary memory unit 1230 of the system 1200, and external input data. The processor 1210 may include various core constructions of the system, for example, a Micro Processor Unit (MPU), a Central Processing Unit (CPU), a Single/Multi Core Processor, a Graphic Processing Unit (GPU), an Application Processor (AP), a Digital Signal Processor (DSP), etc. The processor 1200 may include various logic elements, for example, gates implemented by a combination of transistors formed over a semiconductor substrate, flip-flops, etc.

The main memory unit 1220 may temporarily store or shift program codes or data received from the auxiliary memory device 1230, such that it can execute the program corresponding to the stored or shifted codes or data. The main memory unit 1220 may include the semiconductor device according to the embodiment. The main memory unit 1220 may include various volatile memory units having contents to be deleted when powered off, for example, Static Random Access Memory (SRAM), a Dynamic Random Access Memory (DRAM), etc. The main memory unit 1220 may further include various non-volatile memory units having contents to remain unchanged when powered off, for example, a Phase Change Random Access Memory (PRAM), a Resistive Random Access Memory (RRAM), a Spin Transfer Torque Random Access Memory (STTRAM), a Magnetic Random Access Memory (MRAM), etc. The main memory unit 1220 may include not only various logic elements, for example, gates implemented by a combination of transistors formed over a semiconductor substrate, flip-flops, etc., but also memory devices for storing data.

The auxiliary memory unit 1230 is a memory device for storing a program code or data. The auxiliary memory unit 1230 may store a large amount of information or data whereas it operates at a lower speed than the main memory unit 1220. The auxiliary memory unit 1230 may further include data storage systems, for example, a magnetic tape using a magnetic field, a magnetic disc, a laser disc using light, a magneto-optical disc using the magnetic disc and the laser disc, a Solid State Disc (SSD), a Universal Serial Bus (USB) memory, a Secure Digital (SD), a mini Secure Digital (mSD) card, a micro SD, a high-capacity Secure Digital High Capacity (SDHC), a memory stick card (MSC), a Smart Media (SM) card, a Multi Media Card (MMC), an Embedded MMC (eMMC), a Compact Flash (CF) card, etc. The auxiliary memory unit 1230 may include not only various logic elements, for example, gates implemented by a combination of transistors formed over a semiconductor substrate, flip-flops, etc., but also memory devices for storing data.

The interface unit 1240 may be configured to exchange command and data between the system of this embodiment and an external device, and may be any of a keypad, a keyboard, a mouse, a speaker, a microphone, a display, a variety of Human Interface Devices (HIDs), a communication device, etc., which are configured to achieve data communication through a transmission line. The communication device may include a module coupled to a wired network and a module coupled to a wireless network. The wired network module may include a Local Area Network (LAN), a Universal Serial Bus (USB), an Ethernet, a Power Line Communication (PLC), etc. The wireless network module may include an Infrared Data Association (IrDA), a Code Division Multiple Access (CDMA), a Time Division Multiple Access (TDMA), a Frequency Division Multiple Access (FDMA), a Wireless LAN, a Zigbee, a Ubiquitous Sensor Network (USN), a Bluetooth, a Radio Frequency Identification (RFID), a Long Term Evolution (LTE), a Near Field Communication (NFC), a Wireless Broadband Internet (Wibro), a High Speed Downlink Packet Access (HSDPA), a Wideband CDMA (WCDMA), a Ultra WideBand (UWB), etc., which are configured to achieve data communication without using a transmission line.

The system 1200 may include a through silicon via (TSV) formed over a semiconductor substrate of the processor 1210, the main memory unit 1220, or the auxiliary memory unit 230, etc. so as to communicate with various external devices at high speed. The processor 1210, the main memory unit 1220, the auxiliary memory unit 1230, etc. may include a plurality of TSVs. In accordance with the aforementioned embodiments, the semiconductor substrate may include a gettering layer and a deep-well region. Here, the gettering layer is formed of a first-type impurity and a second-type impurity so as to perform metal-ion gettering, and the deep-well region is formed over the gettering layer of the semiconductor substrate. The processor 1210, the main memory unit 1220, and the auxiliary memory unit 1230, etc. of the system 1200 according to the embodiment may include the gettering layer formed over the semiconductor substrate, resulting in increased reliability of a TSV structure. As a result, the system 1200 having high reliability can operate at a high speed.

Figure 16:
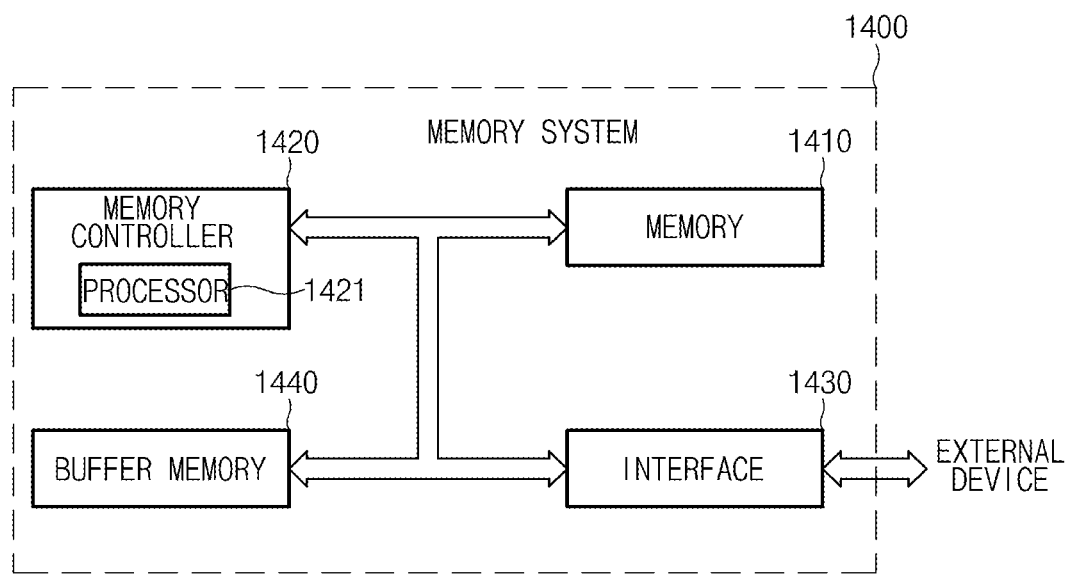
FIG. 16 is a block diagram illustrating a memory system according to an embodiment.

FIG. 16 is a block diagram illustrating a memory system 1400 according to an embodiment of the present invention.

Referring to FIG. 16, the memory system 1400 may include a non-volatile memory 1410 for storing data, a memory controller 1420 for controlling the non-volatile memory 1410, and an interface 1430 coupled to the external device. The memory system 1400 may be configured in the form of a card, for example, a Solid State Disc (SSD), a Universal Serial Bus (USB) memory, a Secure Digital (SD) card, a mini Secure Digital (mSD) card, a micro SD card, a Secure Digital High Capacity (SDHC), a memory stick card, a Smart Media (SM) card, a Multi Media Card (MMC), an embedded MMC (eMMC), a Compact Flash (CF) card, etc.

The memory 1410 for storing data may further include a non-volatile memory, for example, a Read Only Memory (ROM), a Nor Flash Memory, a NAND Flash Memory, a Phase Change Random Access Memory (PRAM), a Resistive Random Access Memory (RRAM), a Magnetic Random Access Memory (MRAM), etc. The memory 1410 serving as a semiconductor device may include not only various logic elements, for example, gates implemented by a combination of transistors formed over a semiconductor substrate, flip-flops, etc., but also memory devices for storing data. The memory 1410 may be comprised of a combination of semiconductor devices to implement higher capacity. The memory 1410 may include a plurality of TSVs in a semiconductor substrate. In the memory 1420, multiple semiconductor devices are stacked through TSVs, and are electrically coupled to each other. In accordance with the aforementioned embodiments, the semiconductor substrate may include a gettering layer and a deep-well region. Here, the gettering layer is formed of a first-type impurity and a second-type impurity so as to perform metal-ion gettering, and the deep-well region is formed over the gettering layer of the semiconductor substrate. The memory 1410 according to the embodiment includes the gettering layer formed over the semiconductor substrate, such that reliability of a TSV structure can be improved and the memory 1410 having high reliability can operate at a high speed.

The memory controller 1420 may control data exchange between the memory 1410 and the interface 1430. For this purpose, the memory controller 1420 may include a processor 1421 configured to calculate/process commands received through the interface 1430 from an external part of the memory system 1400. The memory controller 1420 serving as a semiconductor device may include not only various logic elements, for example, gates implemented by a combination of transistors formed over a semiconductor substrate, flip-flops, etc., but also memory devices for storing data.

The interface 1430 may exchange commands and data between the memory system 1400 and the external device, may be compatible with a Universal Serial Bus (USB) memory, a Secure Digital (SD) card, a mini Secure Digital (mSD) card, a micro SD card, a high-capacity Secure Digital High Capacity (SDHC), a memory stick card, a Smart Media (SM) card, a Multi Media Card (MMC), an Embedded MMC (eMMC), and a Compact Flash (CF) card, and may include similar formats. The interface 1430 may be implemented as different types of interfaces as necessary.

As an interface for an external device, a memory controller, and a memory system are gradually diversified and manufactured to have higher performance, the memory system 1400 according to the embodiment may further include a buffer memory 1440 configured to efficiently perform the data input/output (I/O) operation between the interface 1430 and the memory 1410. The buffer memory 1440 for temporarily storing data may include the above-mentioned semiconductor device. The buffer memory 1440 may include not only various logic elements, for example, gates implemented by a combination of transistors formed over a semiconductor substrate, flip-flops, etc., but also memory devices for storing data. The buffer memory 1440 may be comprised of a combination of semiconductor devices to implement higher capacity. The buffer memory 1440 may include a plurality of TSVs in a semiconductor substrate. In the buffer memory 1440, multiple semiconductor devices are stacked through TSVs, and are electrically coupled to each other. In accordance with the aforementioned embodiments, the semiconductor substrate may include a gettering layer and a deep-well region. Here, the gettering layer is formed of a first-type impurity and a second-type impurity so as to perform metal-ion gettering, and the deep-well region is formed over the gettering layer of the semiconductor substrate. The buffer memory 1440 according to the embodiment includes the gettering layer formed over the semiconductor substrate, such that reliability of a TSV structure can be improved and the buffer memory 1440 having high reliability can operate at a high speed.

In addition, the buffer memory 1440 according to the embodiment may further include a volatile Static Random Access Memory (SRAM), a Dynamic Random Access Memory (DRAM), a non-volatile Phase Change Random Access Memory (PRAM), a Resistive Random Access Memory (RRAM), a Spin Transfer Torque Random Access Memory (STTRAM), a Magnetic Random Access Memory (MRAM), etc.

The memory system 1400 may include a through silicon via (TSV) in a semiconductor substrate of the memory controller 1420 to transmit/receive data to/from data various external devices at high speed. In the memory system 1400, the memory controller 1420, the memory 1410, the buffer memory 1440, etc. are stacked through TSVs, and are electrically coupled to each other. In accordance with the aforementioned embodiments, the semiconductor substrate may include a gettering layer and a deep-well region. Here, the gettering layer is formed of a first-type impurity and a second-type impurity so as to perform metal-ion gettering, and the deep-well region is formed over the gettering layer of the semiconductor substrate. The memory controller 1420 of the memory system 1400 according to the embodiment includes the gettering layer formed over the semiconductor substrate, such that reliability of a TSV structure can be improved and the memory system 1400 having high reliability can operate at a high speed.

As is apparent from the above description, the semiconductor device and the method for forming the same according to the embodiments have the following effects. When forming a through silicon via (TSV), a gettering layer used for copper (Cu) gettering is formed by implantation of phosphorous (P) ions after completion of boron (B) ions, such that a leakage current are prevented from occurring.

The above embodiments are illustrative and not limitative. Various modifications are possible. The embodiments are not limited by the type of deposition, etching polishing, and patterning steps described herein. Nor are the embodiments limited to any specific type of semiconductor device. For example, the embodiments may be implemented in a volatile memory device such as a dynamic random access memory (DRAM) device or non volatile memory device.

What is claimed is:

1. A semiconductor device comprising:
   a semiconductor substrate;
   a gettering layer including a first-type impurity and a second-type impurity in the semiconductor substrate and configured to getter metal impurities; and
   a deep-well region formed over the gettering layer and provided in the semiconductor substrate.

2. The semiconductor device according to claim 1, wherein the first-type impurity includes P-type impurities and the second-type impurity includes N-type impurities.

3. The semiconductor device according to claim 1, wherein the first-type impurity includes boron (B) and the second-type impurity includes phosphorous (P).

4. The semiconductor device according to claim 1, wherein the deep-well region is formed by implantation of the second-type impurity.

5. The semiconductor device according to claim 1, wherein the first-type impurity is implanted with a high density.

6. The semiconductor device according to claim 1, wherein the deep-well region is formed to partially overlap with the gettering layer.

* * * * *